US006841998B1

(12) United States Patent
Griswold

(10) Patent No.: US 6,841,998 B1
(45) Date of Patent: Jan. 11, 2005

(54) MAGNETIC RESONANCE IMAGING METHOD AND APPARATUS EMPLOYING PARTIAL PARALLEL ACQUISITION, WHEREIN EACH COIL PRODUCES A COMPLETE K-SPACE DATASHEET

(76) Inventor: Mark Griswold, Hindenburgring Nord 11, 97318 Kitzingen (DE)

( * ) Notice: Subject to any disclaimer, the term of this patent is extended or adjusted under 35 U.S.C. 154(b) by 323 days.

(21) Appl. No.: 10/117,396

(22) Filed: Apr. 5, 2002

(30) Foreign Application Priority Data

| Apr. 6, 2001 | (EP) | ............................................ 01108732 |
| Apr. 20, 2001 | (DE) | ........................................ 101 19 439 |
| May 29, 2001 | (DE) | ........................................ 101 26 078 |

(51) Int. Cl.$^7$ ............................................... G01V 3/00
(52) U.S. Cl. ...................................................... 324/309
(58) Field of Search ................................ 324/307–309, 324/318; 600/410

(56) References Cited

U.S. PATENT DOCUMENTS

| 4,857,846 | A | | 8/1989 | Carlson |
| 5,910,728 | A | | 6/1999 | Sodickson |
| 5,943,433 | A | * | 8/1999 | Avinash ...................... 382/131 |
| 6,242,916 | B1 | * | 6/2001 | King .......................... 324/309 |
| 6,289,232 | B1 | * | 9/2001 | Jakob et al. ................ 600/410 |
| 6,380,741 | B1 | * | 4/2002 | Hajnal et al. ............... 324/318 |
| 6,396,269 | B1 | * | 5/2002 | Hajnal et al. ............... 324/307 |
| 6,600,944 | B2 | * | 7/2003 | Van Den Brink ........... 600/410 |

FOREIGN PATENT DOCUMENTS

WO        WO 02/086528 A1  * 10/2004

OTHER PUBLICATIONS

P. B. Roemer et al, "The NMR Phased Array," Magn. Reson. Med. 16:192–225 (1990).
J. Kelton et al, "An Algorithm for Rapid Image Acquisition Using Multiple Receiver Coils," Proceedings of the 9th Scientific Meeting of the SMRM, p. 1172 (1989).
J. W. Carlson et al, "Imaging Time Reduction Through Multiple Receiver Data Acquisition and Image Reconstruction," Magn. Reson. Med. 29:681–688 (1993).
J. B. Ra et al, "Fast Imaging Using Subencoding Data Sets From Multiple Detectors," Magn. Reson. Med. 30:142–145 (1993).
D. K. Sodickson et al, "Simultaneous Acquisition of Spatial Harmonics (SMASH): Fast Imaging with Radiofrequency Coil Arrays," Magn. Reson. Med. 38:591–603 (1997).
PM Jakob et al, "Accelerated Cardiac Imaging Using the SMASH Technique," Journal of Cardiovascular Magnetic Resonance 1(2), 153–157 (1999).
DK Sodickson, "Signal–To–Noise Ratio and Signal–To–Noise Efficiency in SMASH Imaging," Magn. Reson. Med. 41, 1009–1022 (1999).
K.P. Prüssmann et al, "SENSE: Sensitivity Encoding for Fast MRI," Magn. Reson. Med. 42(5):952–962 (1999).

(List continued on next page.)

Primary Examiner—Diego Gutierrez
Assistant Examiner—Dixomara Vargas
(74) Attorney, Agent, or Firm—Schiff Hardin LLP

(57) ABSTRACT

In a method and apparatus for magnetic resonance imaging of an interconnected region of a human body on the basis of a partially parallel acquisition (PPA) by excitation of nuclear spins and measurement of the radio-frequency signals produced by the excited nuclear spins, a number of spin excitations and measurements of an RF response signal are implemented simultaneously in every component coil of a number of RF reception coils. As a result a number of response signals are acquired that form a reduced dataset of received RF signals for each component coil. Additional calibration data points are acquired for each reduced dataset. A complete image dataset is formed for each component coil on the basis of the reduced dataset for that component coil and at least one further, reduced dataset of a different component coil. A spatial transformation of the image dataset of each component coil is implemented in order to form a complete image of each component coil.

20 Claims, 6 Drawing Sheets

OTHER PUBLICATIONS

PM Jakob et al, "AUTO–SMASH: a Self–Calibrating Technique for SMASH Imaging," MAGMA 7:42–54 (1998).

DK Sodickson et al, "Generalized SMASH", Proceedings of the Eighth Scientific Meeting of the International Society for Magnetic Resonance in Medicine, p. 273 (2000).

MA Griswold et al, Parallel Imaging with Localized Sensitivites (PILS) MRM 44:602–609 (2000).

RM Heidemann et al, "Variable Density AUTO–SMASH (VD–AUTO–SMASH)," Proceedings of the Eighth Scientific Meeting of the International Society for Magnetic Resonance in Medicine, p. 274 (2000).

M.A. Griswold, et al, "An RF Coil Array Designed Specifically for Cardiac SMASH Imaging," Proceedings of the 6th Scientific Meeting of the ISMRM, p. 437 (1998).

M. A. Griswold et al, Resolution Enhancement In Single Shot Imaging Using Simultaneous Acquisition of Spatial Harmonics (SMASH), MRM 41:1236–1245 (1999).

* cited by examiner

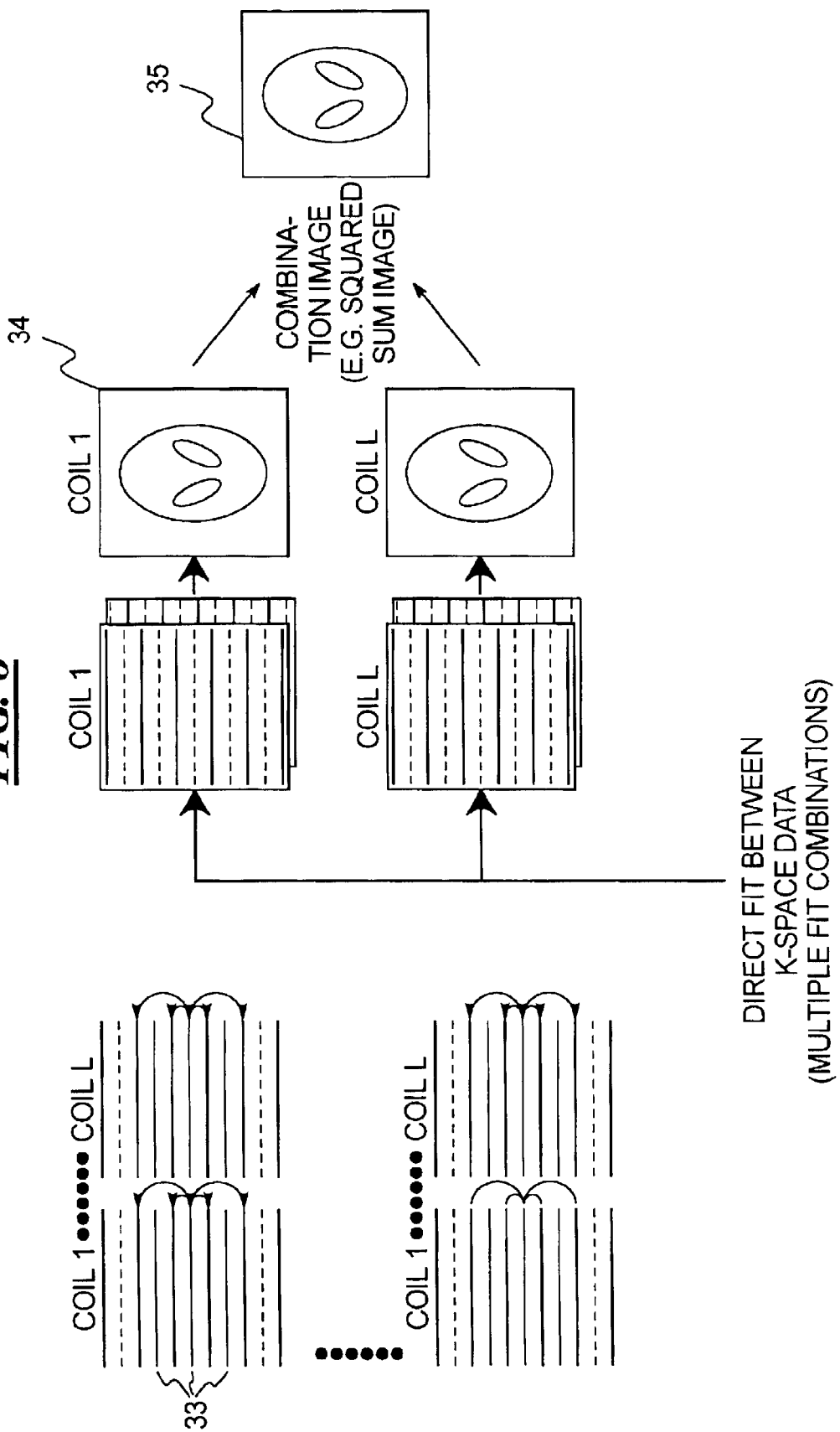

MAGNETIC RESONANCE IMAGING METHOD AND APPARATUS EMPLOYING PARTIAL PARALLEL ACQUISITION, WHEREIN EACH COIL PRODUCES A COMPLETE K-SPACE DATASHEET

BACKGROUND OF THE INVENTION

1. Field of the Invention

The present invention is directed in general to nuclear magnetic resonance tomography (also called magnetic resonance imaging—MRI) as employed in medicine for examining patients. The present invention is particularly directed to a magnetic resonance tomography apparatus as well as to a method for the operation thereof wherein the technique referred to as partially parallel acquisition (PPA) is employed.

2. Description of the Prior Art

MRI is based on the physical phenomenon of nuclear magnetic resonance and has been successfully utilized as an imaging method in medicine and in biophysics for more then fifteen years. Given this examination method, the subject is subjected to a strong, constant magnetic field. As a result, the nuclear spins of the atoms in the subject, that were previously irregularly oriented, are aligned. Radio-frequency pulses can then excite these "ordered" nuclear spins to a specific resonance. This resonance generates the actual measured signal in MRI that is registered with suitable reception coils. By utilizing non-uniform magnetic fields generated by gradient coils, the test subject can be spatially encoded in all three spatial directions. The method allows a free selection of the slice to be imaged, and as a result tomograms of the human body can be registered in all directions. MRI has a tomographic method in medical diagnostics is mainly distinguished as a "non-invasive" examination method with versatile contrast capability. Due to the excellent presentation of the soft tissue, MRI has developed to a method that is often superior to x-ray computed tomography (CT). MRI is currently based on the application of spin echo sequences and gradient echo sequences that enable an excellent image quality with measurement times on the order of magnitude of minutes.

Constant technological improvement of components of MRI apparatuses and the introduction of fast imaging sequences have increased the areas of employment in medicine for MRI. Real-time imaging for supporting minimally invasive surgery, functional imaging in neurology and profusion measurement in mapiology are only a few examples. Despite the technical progress in the construction of MRI apparatuses, the exposure time of an MRI image remains the limiting factor for many applications of MRI in medical diagnostics. Further enhancement in the performance of MRI apparatus is limited from a technical point of view (feasibility) and for reasons of patient protection (stimulation and tissue heating). In recent years, many efforts have therefore been undertaken to develop and to establish new approaches in order to achieve further shortening in the image measuring time.

One approach for shortening the acquisition time is to reduce the number of image data to be registered. In order to obtain a complete image from such a reduced data set, either the missing data must be reconstructed with suitable algorithms or the faulty image must be corrected from the reduced data. The registration of the data in MRI occurs in k-space (synonym: frequency domain). The MRI image in the image domain is linked by Fourier transformation with the MRI data in k-space. The location encoding of the subject that defines k-space occurs with gradients in all three spatial directions. A distinction is made between the slice selection (determines an exposure slice in the subject, usually the z-axis), the frequency encoding (defines a direction in the slice, usually the x-axis) and the phase encoding (determines the second dimension within the slice, usually the y-axis). Without limitation to universal applicability, a Cartesian k-space is assumed below, this being sampled line-by-line. The data of an individual k-space row are frequency-encoded upon readout with a gradient. The row in the k-space has the spacing $\Delta k_y$ that is generated by a phase encoding step. Since the phase encoding consumes much time compared to other location encodings, most methods for shortening the image measuring time are based on a reduction of the number of time-consuming phase encoding steps. All methods referred to as partially parallel acquisition, abbreviated as PPA below, are based on the above principle.

The basic idea in PPA imaging is that k-space data are registered not by an individual coil but, for example, by a linear arrangement of component coils, a coil array. Each of the spatially independent coils of the array carries certain spatial information that is utilized in order to achieve a complete location encoding by a combination of the simultaneously acquired coil data. This means that a number of omitted lines shifted in k-space can be determined from a single, registered k-space row.

The PPA methods thus employ spatial information that are contained in the components of a coil arrangement in order to partially replace the time-consuming phase encoding, which is normally generated using a phase encoding gradient. As a result, the image measuring time corresponding to the ratio of a number of lines of the reduced data set relative to the number of lines of the conventional data set (i.e., a complete data set) is reduced. In a typical PPA acquisition, only a fraction (½, ⅓, ¼, etc.) of the phase encoding lines is acquired compared to the conventional acquisition. A specific reconstruction is then applied to the data in order to reconstruct the missing k-space rows, and thus to obtain the complete field of view (FOV image in a fraction of the time).

Whereas some of these PPA techniques (SMASH, SENSE, GSMASH, which are described in brief below) have been successfully employed in many areas of MRI —SMASH and SENSE must be given priority—, the most significant disadvantage of these methods is that the complex sensitivity of every individual component coil must be exactly known. This is frequently problematical in practice since the experimental determination of the coil sensitivities is greatly hindered due to disturbances as a result of noise and—even more important—due to spin density fluctuations in the tissue, and thus leads to error-affected reconstructions. It is specifically this problem that still restricts a widespread clinical application of PPA methods.

First, the SMASH method invented by Sodickson in 1997 shall be described (D. K. Sodickson, W. J. Manning, Simultaneous Acquisition of Spatial Harmonics (SMASH): Fast Imaging with Radiofrequency Coil Arrays, Magn. Reson. Med. 38:591–603 (1997)). SMASH stands for "SiMultaneous Acquisition of Spatial Harmonics". As mentioned above, this is a PPA method. Data are simultaneously acquired from spatially separate and independent coils that are arranged in phase encoding direction. By linear combination of these coil data, a spatial modulation of the signal is achieved, this having been achieved in conventional methods by the switching of a phase encoding gradient, as a result of which time-consuming phase encoding steps are eliminated. Only a reduced k-space thus is registered; the registration time is shortened corresponding to the reduction of this k-space. The missing data are then reconstructed after the actual data acquisition by suitable linear combinations of the coil data sets.

Sodickson et al thus showed that a row of k-space can be reconstructed by employment of linear combinations of signals acquired by an arrangement of coils according to the SMASH technique when the following always applies:

$$\sum_{l=1}^{L} n_l^{(m)} C_l(y) = C^0 e^{im\Delta k_y}. \tag{1}$$

The quantity $C^0$ is a phase-corrected sum of the individual coil sensitivities; in the idealized case, this constant would be equal to one over the entire region. The exponential term describes a sinusoidal modulation of the real part and the imaginary part. The number of oscillations of this modulation over the FOV is determined by the number m. The designation m=0, 1, 2, . . . , mean the spatial harmonic of the zero-th, first, second, . . . order of the coil sensitivities.

The quantity $C_l(y)$ is the coil sensitivity of the coil l of a total of L coils. Further, $n_1^{(m)}$ SMASH weighting factors are required for the linear combination of the coil sensitivities in order to generate spatial harmonics of the order m. The coil sensitivity profiles $C_l(y)$ are normally determined by a separate acquisition using a proton density-weighted FLASH or similar sequence. When the coil sensitivities are known, the spatial harmonics can be calculated in purely mathematical form therewith. The weighting factors $n_1^{(m)}$ thus remain as the only unknown quantity in Equation (1). The determination of these coefficients is implemented such that the coil sensitivity profiles are fitted to the profiles of the spatial harmonics. With the assistance of these coil weighting factors, different lines can now be reconstructed from a single, acquired line; this is established by $$S(k_y + m\Delta k_y) = \sum_{k_y=-N_y/2}^{N_y/2-1} \sum_{l=1}^{L} n_1^{(m)} C_1(y) p(y) e^{ik_y y} \tag{2}$$

$$S(k_y + m\Delta k_y) = \sum_{k_y=-N_y/2}^{N_y/2-1} p(y) e^{i(k_y - m\Delta k_y)y} \tag{3}$$

wherein p(y) indicates the spin density of the image to be reconstructed along the y-axis (the x-dependency of the image was left out of consideration for reasons of clarity). The procedure in the reconstruction is schematically shown in FIG. 2, whereby a single line was reconstructed from another acquired line.

In the SMASH method, exact knowledge of the coil sensitivity distribution $C_l(y)$ of each coil along the y-direction is required, this usually being determined via a separate registration. Due to disturbances as a result of noise and spin density fluctuations within the subject, it is usually extremely difficult to determine this. As shown in FIG. 2, an outer coil map is employed in order to determine the complex coefficients for the linear combination of each and every one of the data sets of coil 1 through coil L of each harmonic m (left). This enables at least one offset line to be reconstructed from a normally acquired line. At least two linear combinations are implemented, leading to two shifted data sets 23 that are combined to form a complete data set. This data set is then Fourier-transformed in order to generate the ultimate image. This image has the composite sensitivity and the signal-to-noise ratio S/N of an aggregate phase image 24.

Since, as already mentioned, it can be extremely difficult in practice to identify the coil sensitivity profiles $C_l(y)$, Jakob et al invented the Auto-SMASH technique (Jakob P M, Griswold M A, Edelman, R R, Sodickson D K, Auto-SMASH: a self-calibrating technique for SMASH imaging. MAGMA 7:42–54 (1998)). In this technique, additional lines, referred to as "auto calibration signals" (referred to below as ACS lines) are acquired at intermediate positions in the k-space. These lines would be skipped in a SMASH acquisition. The determination of the coil weighting factors in Auto-SMASH occurs via a fit between the ACS lines and the conventionally acquired lines. The determination of the weighting factors and the reconstruction occur directly in k-space. This process can be illustrated with the following equation $$\sum_{l=0}^{L} n_1^{(0)} S^{ACS}(k_y - m\Delta k_y) = \sum_{l=0}^{L} n_1^{(m)} S(k_y) \tag{4}$$

whereby $n_1^{(m)}$ again reference the weighting factors for coil l given a k-space offset of $m\Delta k_y$ (see FIG. 3). In general, the weightings $n_1^{(0)}$ of the zero-h harmonic in the above equation are arbitrary; however, these are equated with constant phase offset in most instances of a unit quantity, whereby the phase aligns the signals of each of the respective coils in the arrangement. This leads to an ultimate image with the intensity profile of an aggregate phase image.

FIG. 3 is a schematic diagram of a conventional AUTO-SMASH reconstruction (Jakob et al). Instead of an external coil map, at least one extra line 25 is acquired in addition to the normal SMASH data set. These extra lines are employed in order to determine the complex coefficients measured via a fit between the ACS lines and regularly measured lines that are required in order to generate a k-space offset of $n\Delta k_y$, which conventionally occurs by activating a phase encoding gradient. As in SMASH, at least two linear combinations are implemented, which lead to two shifted data sets 26. These data are then combined to form a complete data set and are subsequently Fourier-transformed in order to generate the ultimate, composite image 27. This image has the composite sensitivities and the S/N of a phase-summed image.

Whereas it has been shown that the AUTO-SMASH method functions well in some instances, it has been shown in many other instances how noise and weak coil signal degrade the AUTO-SMASH reconstruction, particularly given high acceleration factors.

Heidemann et al (Heidemann, R M, Griswold, M A, Haase A, Jakob P M, Variable Density AUTO-SMASH (VD-AUTO-SMASH), Proceedings of the Eighth Scientific Meeting of the International Society for Magnetic Resonance in Medicine (page 274 (2000)) therefore proposed an expansion of the AUTO-SMASH technique, referred to as variable density AUTO-SMASH (VD-AUTO-SMASH), wherein a few extra sets of ACS lines are sampled in addition to the required minimum set of ACS lines. It has been shown that these extra lines improve the determination of the coil weighting factors under existing noise and imprecise coil signal, since additional fit combinations can be implemented. Moreover, these extra lines can be directly integrated into the k-space. As a result, reconstructed and, consequently, error-affected lines are replaced. Given the same number of acquired lines, this leads to an often improved image quality compared to the normal AUTO-SMASH acquisition and reconstruction. The quantity referred to as artifact energy is employed as a quality feature during the further course thereof. This is the difference energy of a reconstructed image and a completely acquired reference image. The artifact energy, accordingly, is a criterion for disturbances in the image that are caused by the reconstruction. The image quality becomes better as the value of the artifact energy becomes lower. The possibility of employing additional lines for determining the coil weighting factors in AUTO-SMASH and VD-AUTO-SMASH is a significant improvement in the overall imaging efficiency compared to other PPA techniques, since no additional time is required in order to acquire separate coil maps; moreover, all additionally acquired lines can be directed integrated into the reconstructed k-space, leading to an improved image quality.

The procedure in VD-AUTO-SMASH is shown in FIG. 4: as in AUTO-SMASH, a few extra lines 28 that would be normally skipped are acquired in addition to the normal SMASH data sets. These extra lines are employed in order—by a fit between these ACS lines and regularly measured lines—to determine the complex coefficients that are needed in order to generate a k-space offset of $m\Delta k_y$, which conventionally occurs by activating a phase gradient. The additionally acquired fit combinations lead to an improved determination of the coil weighting factors compared to AUTO-SMASH and SMASH. As in SMASH, at least two linear combinations are generated that lead to two shifted data sets 29. Moreover, the extra lines that are acquired can be directly integrated into the reconstructed data set, which leads to an increase in the image quality. These data sets are combined to form a complete data set and are subsequently Fourier-transformed in order to generate the ultimate image. This image has the composite sensitivity and the S/N of a phase-summed image.

The additional blocks of ACS lines enable the possibility of an enhanced performance capability in the case of noise since different, additional combinations can be implemented according to Equation 4 and averaged in order to obtain more optimum weightings. Moreover, these lines can be employed in the final image reconstruction, which leads to a lower artifact energy.

In the VD-AUTO-SMASH study, an outer reduction (ORF—Outer Reduction Faction) was defined that is essentially the acceleration factor that is employed in the outer parts of the k-space. It was shown in this study that the best image quality is obtained for the highest ORF that is possible for a given imaging arrangement, meaning that a larger region of the central k-space is densely sampled. For the same number of acquired lines compared to an AUTO-SMASH acquisition resulting therefrom, this strategy leads to a lower artifact energy, i.e. to an improvement of the quality of the ultimate, reconstructed image 30.

Sodickson has recently presented an even more general presentation of SMASH that employs more then one measured line in order to reconstruct each omitted k-space line (Sodickson D K, "A Generalized Basis Approach To Spatial Encoding With Coil Arrays: SMASH-SENSE Hybrids And Improved Parallel MRI At High Accelerations", Proceedings of the Eighth Scientific Meeting of the International Society for Magnetic Resonance in Medicine, page 273 (2000)). Sodickson showed that this more general approach—compared to the standard SMASH reconstructions —leads to a lower artifact power for higher acceleration factors as well as to a better S/N in some instances.

This most recent improvement with respect to SMASH-like reconstruction methods is referred to as generalized SMASH (G-SMASH). In this reconstruction (FIG. 5), a number of acquired lines are employed for the linear combination, in contrast to the individual acquired line as employed in the conventional SMASH acquisition. It was proposed to employ a blockwise reconstruction in the reconstruction wherein more than one normally acquired lines are employed in order to reconstruct an individual block of lines. The reconstruction then proceeds to the next block.

FIG. 5 schematically shows a generalized SMASH/SENSE hybrid reconstruction (Sodickson). As in SMASH, an external coil map is employed in order to determine the complex coefficients for the linear combinations for each of the data sets of coil 1 through coil L of each harmonics m by fitting the coil sensitivity profiles to the spatially harmonic profiles. In this case, however, each line is reconstructed from a block of different acquired lines instead of from an individual acquired line as in SMASH. At least two linear combinations are implemented for each block, which leads to two shifted data sets 31. These blockwise combinations are applied over the entire remaining k-space. The data are then Fourier-transformed in order to generate the ultimately composed image 32. Although this image has approximately the composite sensitivity and the S/N of a phase-summed image, the signal-to-noise ratio was capable of being improved somewhat by employing a number of lines.

A principal problem of all SMASH-like reconstructions—in addition to the termination of coil sensitivities—is that the S/N of the reconstructed image corresponds only to that of a phase-summed image, since there is no possibility of forming a square sum image. Completely reconstructed individual coil images are required for the formation of a square sum image. In addition to the inherent S/N losses, errors also arise because the k-space data of the various coils in a SMASH-typical reconstruction are combined by complex addition. In instances wherein the phases of the different coils are not exactly the same, or in instances wherein slight phase differences exist between individual noise signals and the underlying, normal signal, signal losses or even complete cancellation can be observed. For this reason, great care was applied in the previous SMASH studies to insure that the phases of the coils were identically directed before the reconstruction. The only way of measuring this phase is to implement a separate measurement of the noise correlation ratio between the coils. This method of determining the appropriate coil phases can fail in many instances, which may lead to an unsatisfactory image quality and/or to serious phase cancellation.

In summary, it can be stated that all known PPA methods known up to now have two significant disadvantages:
1. In all known SMASH/AUTO-SMASH-like PPA techniques, there is a relatively high loss in the S/N of
$$\sqrt{\text{number of coils}}$$

The reconstruction of all known PPA techniques ensues by complex addition of the individual picture elements, which can lead to reconstruction artifacts (phase cancellation of anti-phase elements).

SUMMARY OF THE INVENTION

It is an object of the present invention to provide an apparatus and a method for magnetic resonance imaging that enable a better quality of the reconstructed images on the basis of a partially parallel acquisition (PPA).

This object is inventively achieved in a method for magnetic resonance imaging of an interconnected region of a human body on the basis of a partially parallel acquisition (PPA) by exciting nuclear spins and measuring the radio-frequency signals indicating the excited spins, wherein a number of excitations as well as measurements of respective RF response signals are simultaneously measured in every component coil of a number of RF reception coils, resulting in a number of response signals being acquired that form a reduced dataset of received RF signals for each component coil. In addition to the reduced dataset, additionally acquired calibration data points are acquired. A complete image dataset for each component coil is formed on the basis of the reduced dataset of that component coil and at least one further reduced dataset of a different component coil; and a spatial transformation of the image dataset of each component coil is implemented in order to form a complete image of each component coil.

The complete component coil images can be combined to form a single composite image by combining the complete component images.

The formation of the single composite image can be implemented by employing a square sum reconstruction.

The number of spin excitations and measurements of the RF reply signals should ensue line-by-line in k-space, and each reduced dataset should have at least one corresponding additionally acquired calibration line.

Advantageously, the complete image dataset is formed by a blockwise reconstruction, with more than one data point or one data line of a reduced dataset of a corresponding component coil, and more than one data point or a data line of at least one further, reduced dataset of a different component coil, being employed for reconstruction of each and every data point or each and every data line of the complete image dataset of each component coil.

The formation of an image dataset for each component coil can be implemented on the basis of all reduced datasets of all component coils.

The formation of an image dataset for each component coil advantageously employs spatial harmonics.

The spatial transformation can, for example, be a Fourier transformation.

An inventive apparatus for magnetic resonance imaging has a magnet for generating a uniform magnetic field, an arrangement for exciting nuclear spins in an interconnected region of a human body, as well as an arrangement for acquiring the response signals of the excited spins, the arrangement for exciting and for acquiring signals operate in repeated cycles in order to simultaneously measure signal responses in each component coil of a number of RF reception coils. Further, the apparatus has an arrangement for receiving a reduced dataset of measured RF signals of each component coil, with at least one additionally acquired set of calibration data points for each reduced dataset. The apparatus also has a device for forming a complete dataset for each component coil on the basis of the reduced dataset of a corresponding component coil and at least one further, reduced dataset of a different component coil.

The apparatus also has a device for implementing a spatial transformation of the image dataset of each component coil in order to generate a complete image for each component coil.

The apparatus generates a single composite image by a combination of the complete component coil images.

This apparatus can generate the composite, single image by square sum reconstruction.

The device which produces the spin excitations and the measurement device for the RF response signals do so line-by-line, including the acquisition of at least one additionally acquired calibration line for each reduced dataset.

The apparatus for generating a complete image dataset in an embodiment implements a blockwise reconstruction, with more than one data point or one data line from a reduced dataset of a corresponding component coil, and more than one data point or one data line of at least one further dataset of a different component coil, being employed for reconstruction of each and every data point or data line of the complete image dataset of each and every component coil.

The apparatus for forming an image dataset in an embodiment generates an image dataset for each component coil on the basis of all reduced datasets of all component coils.

Further, this apparatus for generating an individual, composite image in an embodiment generates an image dataset for each component coil upon using spatial harmonics.

The aforementioned, spatial transformation can be a Fourier transformation.

The apparatus for signal acquisition can be formed by a number of component coils that receive the signals, with the component coils forming a regular arrangement.

In particular, the number of component coils can form a linear arrangement.

DESCRIPTION OF THE DRAWINGS

FIG. 6 schematically shows an image reconstruction according to the inventive method (GRAPPA).

DESCRIPTION OF THE PREFERRED EMBODIMENTS

Figure 1:
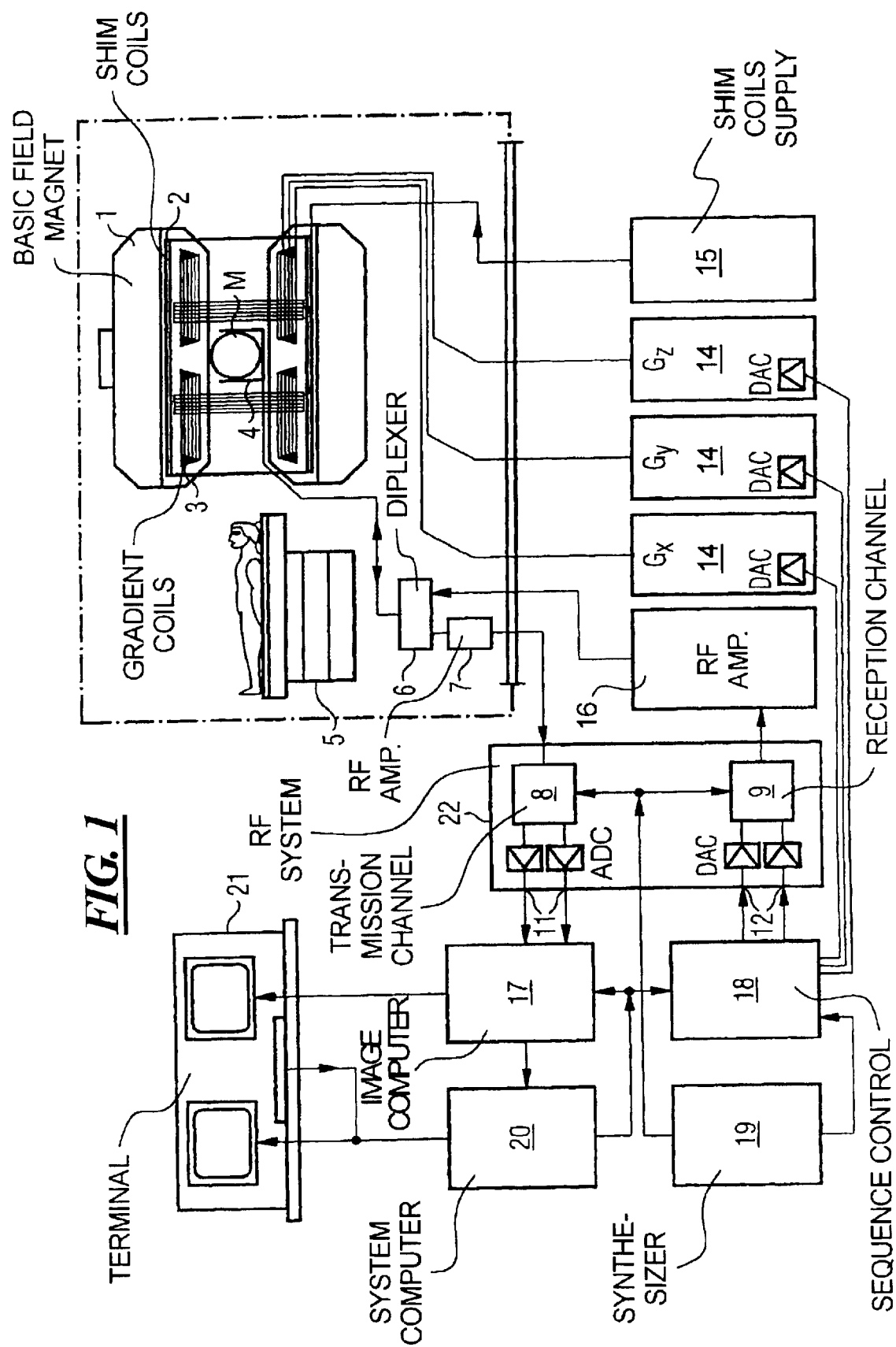
FIG. 1 schematically illustrates the basic components of magnetic resonance tomography apparatus with which the inventive method can be implemented.
Figure 2:
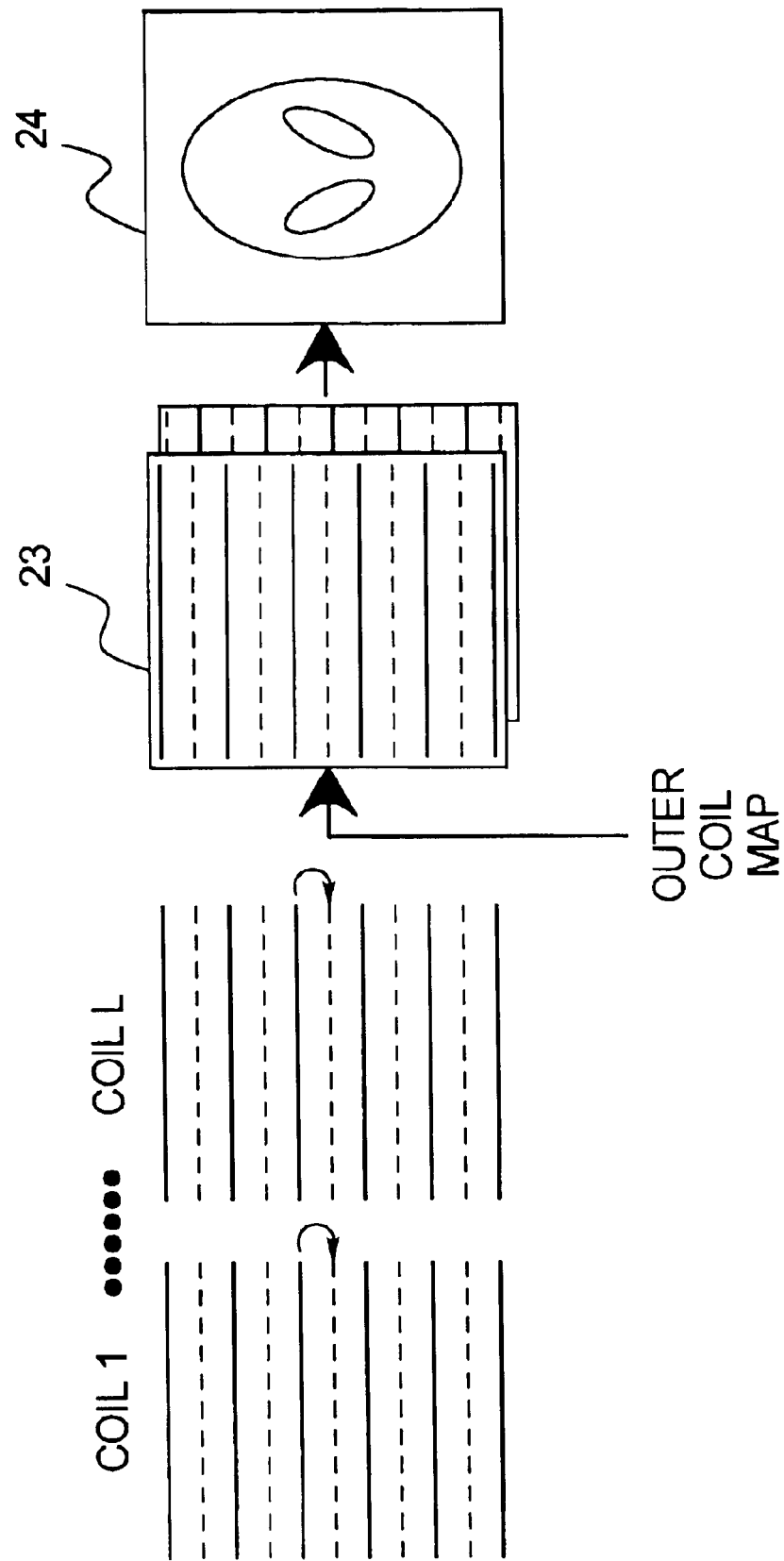
FIG. 2, as noted above, schematically shows an image reconstruction according to the SMASH method.
Figure 3:
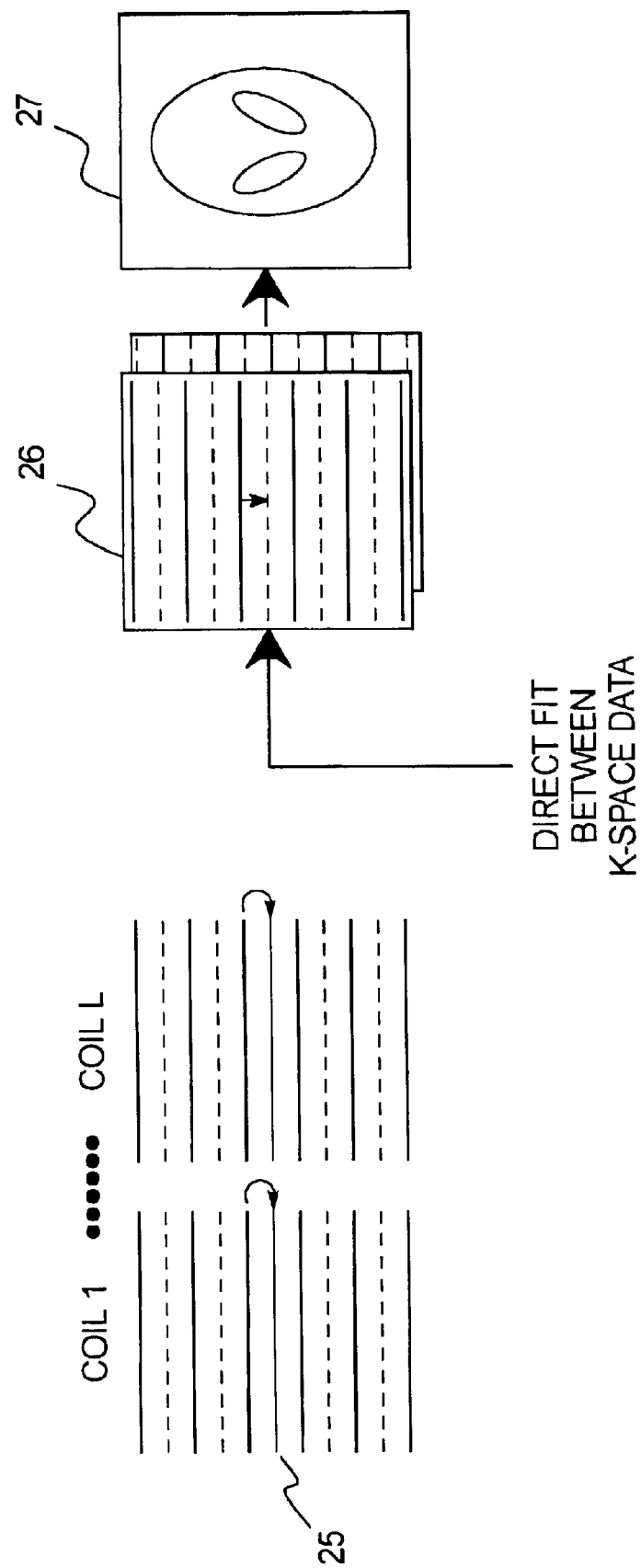
FIG. 3, as noted above, schematically shows an image reconstruction according to the AUTO-SMASH method.
Figure 4:
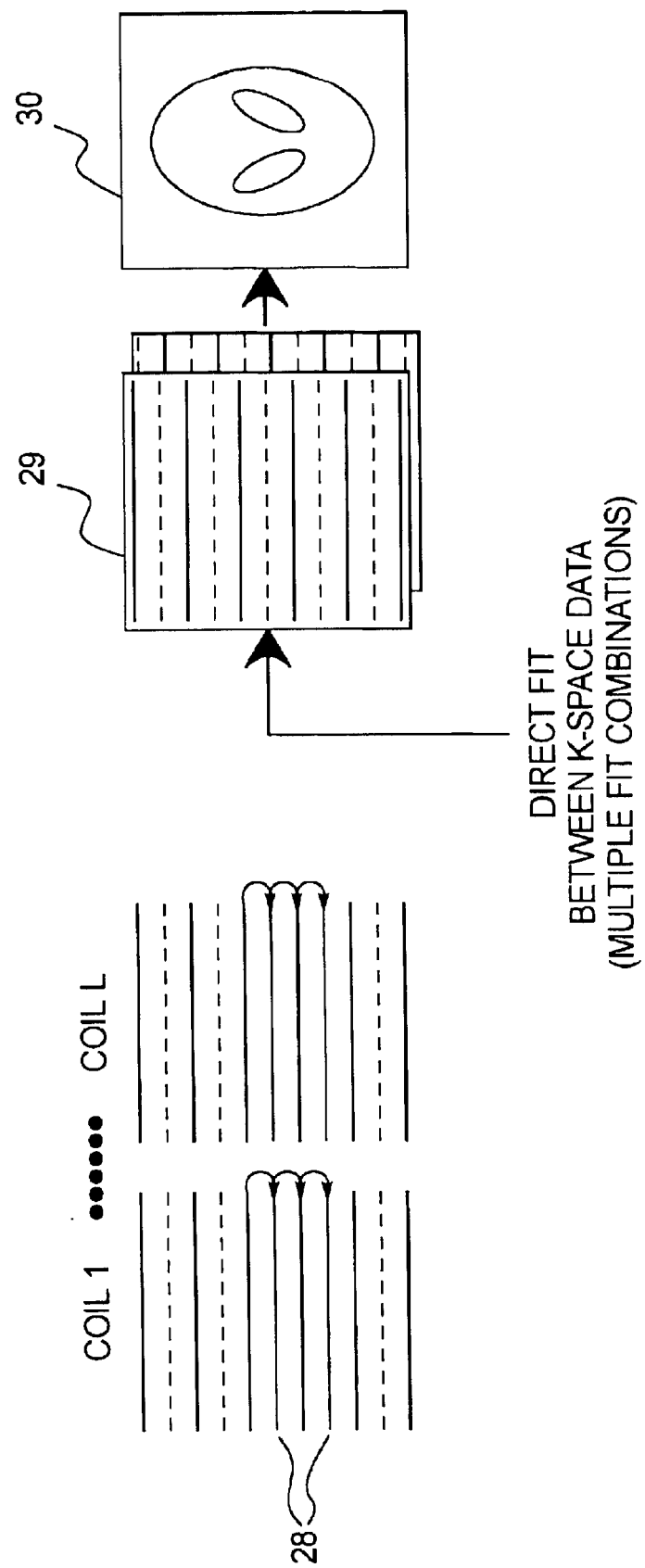
FIG. 4, as noted above, schematically shows an image reconstruction according to the VD-AUTO-SMASH method.
Figure 5:
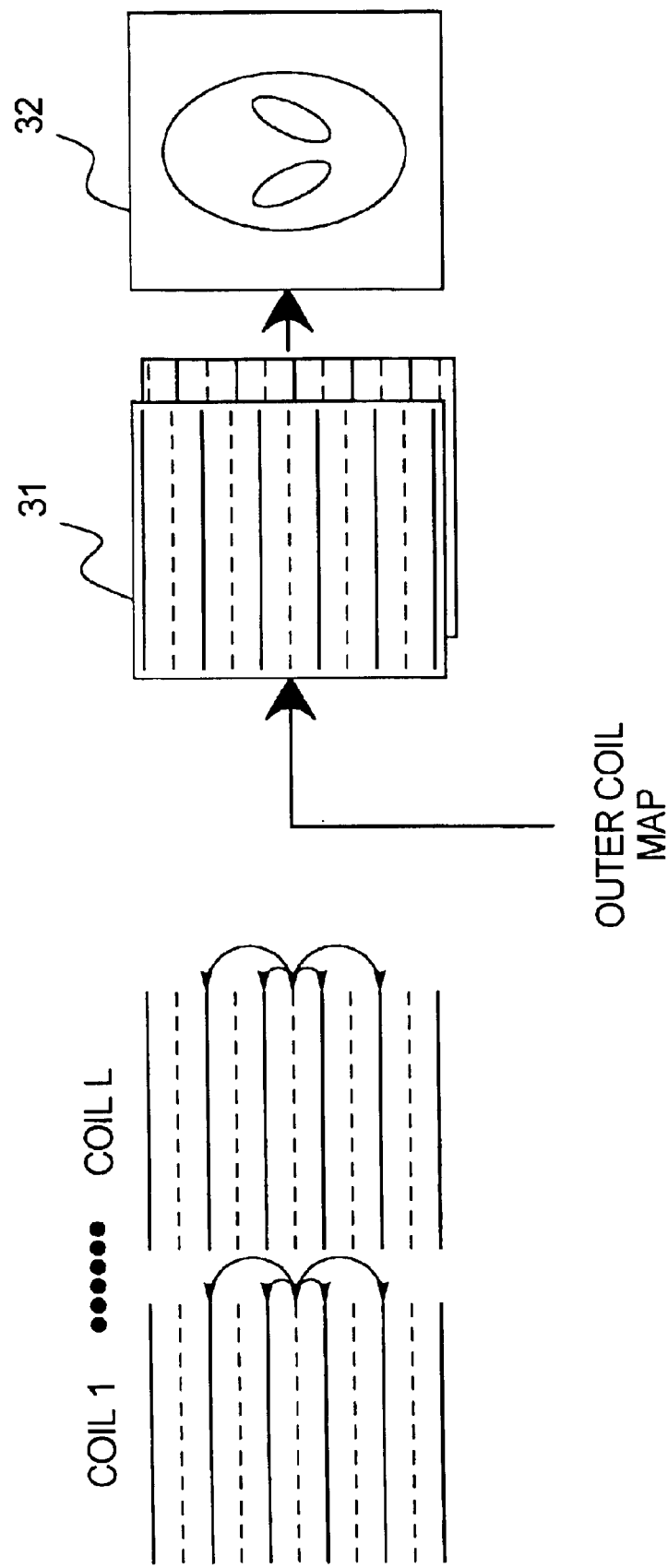
FIG. 5, as noted above, schematically shows an image reconstruction according to the GSMASH method.

FIG. 1 schematically illustrates a magnetic resonance imaging (tomography) apparatus for generating a nuclear magnetic image of a subject according to the present invention. The components of the nuclear magnetic resonance tomography apparatus correspond to those of a conventional tomography apparatus, but it is controlled according to the invention. A basic field magnet 1 generates a time-constant, intense magnetic field for polarization (alignment) of the nuclear spins in the examination region of a subject such as, for example, a part of a human body to be examined. The high homogeneity of the basic magnetic field required for the nuclear magnetic resonance measurement is defined in a spherical measurement volume M in which the part of the human body to be examined is introduced. For supporting the homogeneity demands and, in particular, for eliminating time-invariable influences, shim plates of ferromagnetic material are attached at suitable locations. Time-variable influences are eliminated by shim coils 2 that are driven by a shim power supply 15.

A cylindrical gradient coil system 3 is built into the basic field magnet 1, the system 3 being composed of three sub-windings. Each sub-winding is supplied with current by an amplifier 14 for generating a linear gradient field in the respective directions of a Cartesian coordinate system. The first sub-winding of the gradient field system 3 generates a gradient $G_x$ in the x-direction, the second sub-winding generates a gradient $G_y$ in the y-direction, and the third sub-winding generates a gradient $G_z$ in the z-direction. Each amplifier 14 has a digital-to-analog converter DAC that is driven by a sequence control 18 for the time-controlled generation of gradient pulses.

A radio-frequency antenna 4 is situated within the gradient field system 3. The antenna 4 converts the radio-frequency pulses emitted by a radio-frequency power amplifier into an alternating magnetic field for exciting the nuclei and aligning the nuclear spins of the subject under examination, or of a region of the subject under examination. The radio-frequency antenna 4 is composed of one or more RF transmission coils and a number of RF reception coils in the form of an arrangement (preferably linear) of component coils. The alternating field proceeding from the precessing nuclear spins, i.e. the nuclear spin echo signals produced as a rule by a pulse sequence composed of one or more radio-frequency pulses and one or more gradient pulses, is also converted into a voltage by the RF reception coils of the radio-frequency antenna 4, this voltage being supplied via an amplifier 7 to a radio-frequency reception channel 8 of a radio-frequency system 22. The radio-frequency system 22 also has a transmission channel 9 wherein the radio-frequency pulses are generated for exciting magnetic nuclear resonance. The respective radio-frequency pulses are digitally presented as a sequence of complex numbers on the basis of a pulse sequence in the sequence control 18 prescribed by the system computer 20. This number sequence—as a real part and an imaginary part—is supplied via respective inputs 12 to a digital-to-analog converter DAC in the radio-frequency system 22 and is supplied from there to a transmission channel 9. In the transmission channel 9, the pulse sequences are modulated onto a radio-frequency carrier signal having a basic frequency corresponding to the resonant frequency of the nuclear spins in the measurement volume.

The switching from transmission mode to reception mode ensues via a transmission/reception diplexer 6. The RF transmission coil of the radio-frequency antenna 4 radiates the radio-frequency pulses, based on signals from a radio-frequency amplifier 16, for excitation of the nuclear spins into the measurement volume M and samples the resulting echo signals via the RF reception coils. The acquired nuclear magnetic resonance signals are phase-sensitively demodulated in the reception channel 8 of the radio-frequency system 22 and are converted via respective analog-to-digital converters ADC into the real part and the imaginary part of the measured signal, which are respectively supplied to outputs 11. An image computer 17 reconstructs an image in accordance with the invention from the measured data acquired in this way. Administration of the measured data, the image data and the control programs ensues via the system computer 20. On the basis of control programs, the sequence control 18 monitors the generation of the respectively desired pulse sequences and the corresponding sampling of k-space. In particular, the sequence control 18 controls the tined switching of the gradients, the emission of the radio-frequency pulses with defined phase and amplitude, as well as the reception of the nuclear magnetic resonance signals. The timing signals for the radio-frequency system 22 and the sequence control 18 is made available by a synthesizer 19. The selection of corresponding control programs for generating a nuclear magnetic resonance image as well as the presentation of the generated nuclear magnetic resonance image ensues via a terminal 21 that has a keyboard as well as one or more picture screens.

The inventive method of partially parallel acquisition (PPA) is presented below. This serves the purpose using an RF coil arrangement for spatial encoding, of accelerating the image acquisition. This technique, as realized, for example, in the magnetic resonance apparatus shown in FIG. 1, is called generalized auto-calibrating partially parallel acquisition (GRAPPA) and is based on the above-described AUTO-SMASH and VD-AUTO-SMASH imaging. A detailed, high-precision coil sensitivity map, as required in the preceding parallel imaging technique SMASH/G-SMASH, is not necessary in GRAPPA. The corresponding information is obtained from k-space data points or lines that were registered in addition to the regularly acquired k-space rows of the reduced dataset. These data points/lines can be integrated into the ultimately reconstructed datasets of the component coils in order to improve the quality of the ultimate image. Compared to a conventional AUTO-SMASH imaging, the inventive modifications leads to a significantly higher image quality with the same amount of acquired k-space data. Moreover, the GRAPPA imaging algorithm can be implemented in such a way in the image computer 17 that, in contrast to earlier PPA methods, complete image datasets are generated from each and every individual component coil. This enables an improved image reconstruction with, for example, the square sum method. As a result, a higher signal-to-noise ratio (S/N) and a better image quality are achieved in the reconstruction than occurs with other PPA methods wherein the steps of image reconstruction and combination are implemented in one step, as in SMASH and AUTO-SMASH.

After the introduction of the inventive GRAPPA technique, the practical application of GRAPPA, including the reconstruction algorithm as well as the analysis of S/N and of the artifacts in the images that are obtained, will be considered.

As already mentioned, GRAPPA represents a developed form of AUTO-SMASH technique. The inventive GRAPPA process can be applied to every individual component coil of the RF reception coil arrangement of RF antenna 4, enabling a conventional square sum reconstruction. An improved S/N is achieved and phase problems that lead to signal attenuation are prevented. The GRAPPA approach is recited point-by-point below. A corresponding graphic presentation of the inventive GRAPPA reconstruction is shown in FIG. 6.

1. Similar to VD-AUTO-SMASH, additional data points/lines are acquired in addition to the normal, reduced dataset, a few lines 33 in the illustrated example.
2. These additional data points/lines are employed upon employment of a specific fit strategy deviating from the standard SMASH methods in order to determine the reconstruction parameters. In contrast to all other SMASH methods, GRAPPA is a single-coil reconstruction method, i.e. a complete k-space dataset is first reconstructed for each individual component coil of the coil arrangement. This using two or more single-coil datasets. Viewed graphically, this means that different k-space lines from different individual coil datasets are employed in order to reconstruct missing k-space lines of a single coil dataset. The reconstruction rule, similar to VD-AUTO-SMASH, is derived by fitting to the k-space data acquired under point 1. It must be emphasized that the central idea of a GRAPPA reconstruction is presented by step 2: for each individual component coil of the coil arrangement: a complete k-space dataset is first reconstructed using two or more individual coil datasets. As a final result, an independent and complete individual coil image is obtained for each individual coil, and thus for each corresponding component coil dataset. The reconstruction of the k-space rows within an individual coil dataset can ensue in a sliding block method. The first step is to reconstruct all omitted intermediate lines within a block of k-space rows with the coil weighting factors (defined by all fit combinations employed). In the next step, the block is shifted within the k-space by only a fraction of its size. This causes an omitted k-space row to be multiply reconstructed with different coil weighting factors. Averaging can be subsequently carried out over these multiply defined k-space rows. In contrast to a strict block-by-block mode—the block here is shifted by an amount after its reconstruction that corresponds to its size—, the sliding block reconstruction leads to better results, particularly in the case of faulty reconstruction parameters.

3. In the last step, the raw data of each coil are then Fourier-transformed in order to generate a complete image 34 for each component coil. These can then be combined, for example upon employment of a square sum reconstruction, in order to generate the ultimately composed image 35. As final result, a single image 35 is obtained that has the composite sensitivity and the S/N of a square sum image. Further, all artifacts that arise on the basis of phase cancellation or attenuation are thereby eliminated since the composite coil images have been generated by a magnitude combination. The inventive image reconstruction according to the GRAPPA technique is implemented in the image computer 17 of the magnetic resonance apparatus shown in FIG. 1.

The data fit process and reconstruction process as well as the calculation of the overall image shall, in particular, be presented in greater detail below.

In general, the process of data reconstruction of a line $S_1\{k_y-(m+bA)\Delta k_y\}$ (a line from a single coil dataset) from the normally acquired lines (regularly acquired lines from at least two different coil datasets) employing a sliding block reconstruction, is represented by $$S_1\{k_y(m+bA)\Delta k_y\} = \sum_{l=1}^{L} \sum_{b=0}^{N_b-1} n_1^{(m+bA)} S(k_y - bA\Delta k_y). \quad (5)$$

A represents the acceleration factor i.e., the number of lines that are skipped in the acquisition per block. $N_b$ is the number of regularly acquired lines within a block that are employed for the reconstruction, and b is an index for these regularly acquired lines. When a block size having $N_b$ measured lines is employed in the reconstruction, then there are $N_b$ coil weighting factors $n_1^{(m+bA)}$ for each coil 1.

In GRAPPA, the extra ACS data points or lines are employed for determining a number of complex coil weighting factors for each individual coil, similar to VD-AUTO-SMASH. Compared to a VD-AUTO-SMASH reconstruction wherein a complete k-space dataset of the complete image is calculated, the GRAPPA reconstruction leads to complete individual coil datasets.

The ACS data points/lines can also—after the reconstruction parameters have been determined—be directly integrated into k-space, and as a result the image quality is additionally improved, as was shown in the VD-AUTO-SMASH study. As assumed in this study, it is expected that the use of the maximum ORF is most advantageous, since this yields the highest number of lines in the middle of k-space for the same number of acquired lines. This leads to a better determination of the coil weighting factors as well as to a more stable reconstruction given faulty reconstruction parameters.

In order to overcome the fundamental limitation of a reduced S/N in SMASH/AUTO-SMASH-like PPA imaging methods, unfalsified, full field-of-view (FOV) images of each and every individual coil can be reconstructed independently of one another in the inventive GRAPPA technique with a S/N that corresponds to that of a normal, individual coil acquisition. The uncombined coil images are combined according to the PPA reconstruction upon employment of a conventional array reconstruction in order to obtain an optimum S/N. Additionally, the images can be magnitude combined in order to prevent the possibility of signal loss due to phase cancellation.

In a typical SMASH-reconstruction, the steps for reconstructing the missing k-space rows and combining the final image appear in a single reconstruction step. In GRAPPA, this process is decoupled into a first step of reconstruction of the missing lines of each individual coil and to a second step of image combination in order to optimize the S/N and prevent problems with respect to phase cancellation.

After the reconstruction of the individual coil images, each of these independent images can be combined in order to obtain an ultimate image having a higher S/N than in a conventional phase sum reconstruction. Since the ultimate image combination takes the magnitude of the individual coil images into consideration, any and all phase-related artifacts as occur in all SMASH and AUTO-SMASH-typical imaging methods, can be completely eliminated. This procedure ultimately means that the GRAPPA reconstruction allows the formation of a square sum image as ultimate image, whereas other SMASH or, respectively, AUTO-SMASH-typical acquisition only enable a phase sum reconstruction. This means that GRAPPA always achieves a higher S/N compared to other SMASH or, respectively, AUTO-SMASH implementations.

It must be noted that k-space need not necessarily be sampled line-by-line in the inventive GRAPPA technique. The sampling alternatively can ensue radially, i.e. star-shaped or helically. This, however, means that the direction of the reconstruction no longer need be fixed to the phase encoding direction but can also be varied in the readout direction or the frequency encoding direction. An intermediate point thus can be reconstructed proceeding from all possible positions—i.e. from all possible points that have been acquired.

Only a single set of reconstruction parameters was previously employed along the readout direction—i.e. for a k-space row. In order, however, to optimize the reconstruction in the readout direction or the frequency encoding direction as well, it is meaningful to divide the corresponding line and to employ an optimally adapted set of reconstruction parameters for each section that has arisen in this way. Extra parameters that are optimized for this section are thus defined for each sub-section.

The GRAPPA reconstruction algorithm as described above was implemented in the Matlab Program Environment (the Mathworks, Natick, Mass., USA). Two functions were implemented: one with individual coil reconstruction upon employment of a square sum combination and one with a conventional phase sum combination for comparison.

As already mentioned above, all GRAPPA implementations contain a sliding block procedure for reconstruction. This leads to the problem of weighting each possible reconstructed line. Various possibilities of implementing a weighted average of the different sliding block reconstructions were tested. The quality of the individual fits was identified at a specifically reconstructed line and the S/N that was derived from a reconstruction. Whereas both criteria, quality of the fits and S/N of the reconstructed image, are relevant in practice, the S/N is preferred as a criterion since the fit also typically exhibiting low quality in most instances wherein the S/N is too low for a reconstruction method. The S/N is employed as a weighting criterion for the reconstructed data below. This method of weighting leads to a reconstruction that achieves a high S/N and a low artifact energy and, as has been shown, leads to very good results.

Computer simulations were implemented in order to determine the artifact energy as well as the S/N behavior of GRAPPA given different acceleration factors. To this end, the four-element, linear coil arrangement according to M. A. Griswold, P. M. Jakob, R. R. Edelman, D. K. Sodickson, An RF Coil Array Designed Specifically for Mapiac SMASH Imaging, Proceedings of the 6$^{th}$ Scientific Meeting of the ISMRM, p. 437 (1998) was simulated using an analytical integration of the Biot-Savart law. These simulated coil sensitivities were then employed in combination with an image of a resolution phantom that is usually employed. Retrospectively, a number of datasets having differently reduced encoding, i.e. different acceleration factors, were generated. The artifact energy as well as the S/N behavior of the images reconstructed with GRAPPA were identified. In the simulations for identifying the artifact energy, an ORF of 4 was assumed, and all additionally sampled ACS lines were employed both for determining the reconstruction parameters as well as for direct integration into the complete, individual coil datasets. For the S/N estimates, the ACS lines were not integrated into the datasets in order to be able to better compare the influence of the GRAPPA reconstruction on the S/N.

In order to evaluate the clinical application of the GRAPPA technique, various image studies were made with healthy volunteers. The consent agreement was obtained before each study.

A conventional four-channel CP body array on a 1.5 T Siemens Vision Scanner (Siemens Medical Systems, Erlangen, Germany) was employed for a first set of acquisitions. This arrangement is composed of a maximum of two coils that can be employed for PPA encoding in one direction. No additional coil maps were employed and each line that was acquired was integrated into the k-space.

Further acquisitions were implemented at a 1.5 T Siemens Symphony Scanner, equipped with eight reception channels. Dependent on the body region to be examined, either a prototyped eight-element cardiac array (Siemens Medical Systems, Erlangen, Germany) or an eight-channel head array (MRI Devices Corporation, Waukesha, Wis., USA) was employed. The primary interest of these acquisitions was the examination of the performance capability of GRAPPA in single-shot acquisitions in all regions of the human body. In contrast to multi-shot experiments, these techniques are affected by spin relaxation effects over the entire acquisition time. It could be shown in these instances that it is possible with the GRAPPA method to shorten the acquisition time of an image and to simultaneously improve the image quality in all single-shot imaging sequences.

It must be noted that the image quality compared to the AUTO-SMASH reconstruction is significantly higher given GRAPPA.

The S/N in the non-combined acquisition is far better given low acceleration factors and is never significantly poorer than the phase sum estimate.

The table below shows S/N versus the acceleration factor for GRAPPA and GRAPPA with phase sum reconstruction.

| S/N | 1X | 2X | 3X | 4X |
| --- | --- | --- | --- | --- |
| Relative S/N GRAPPA | 1.000 | 0.706 | 0.522 | 0.443 |
| Relative S/N/Time GRAPPA | 1.000 | 0.999 | 0.905 | 0.887 |
| Relative S/N GRAPPA - Phase sum | 0.660 | 0.654 | 0.480 | 0.448 |
| Relative S/N/Time GRAPPA - Phase sum | 0.660 | 0.926 | 0.832 | 0.896 |

Although modifications and changes may be suggested by those skilled in the art, it is in the intention of the inventor to embody within the patent warranted hereon all changes and modifications as reasonably and properly come within the scope of his contribution to the art.

I claim as my invention:

1. A method for obtaining an image of an interconnected region of a subject by partially parallel acquisition magnetic resonance imaging, comprising the steps of:
    (a) exciting precessing nuclear spins in a region of a subject;
    (b) simultaneously obtaining a plurality of response signals, representing nuclear magnetic resonance signals arising from said precessing nuclear spins, from said region respectively with a plurality of RF reception coils, with each response signal representing a reduced k-space dataset of a totality of all of said response signals;
    (c) additionally obtaining calibration data points for each dataset;
    (d) for each of said RF reception coils, forming a complete k-space dataset in k-space from the reduced k-space dataset from step (c) for that RF reception coil and the reduced k-space dataset from step (c) of at least one other of said RF reception coils; and
    (e) for each of said RF reception coils, spatially transforming the complete image dataset obtained in step (d) to obtain a complete image of said region, and thereby obtaining a plurality of complete images of said region.

2. A method as claimed in claim 1 comprising combining said plurality of complete images to obtain a single composite image of said region.

3. A method as claimed in claim 2 comprising combining said complete images using a square sum reconstruction to obtain said single composite image.

4. A method as claimed in claim 1 wherein each of said reduced datasets represents a plurality of k-space lines, and wherein step (b) comprises entering data from the respective response signals line-by-line respectively into a plurality of k-space datasets for the respective RF reception coils, and wherein step (c) comprises, for each k-space dataset, entering at least one line of said calibration data points.

5. A method as claimed in claim 4 wherein each of said lines is comprised of a plurality of data points, and wherein step (d) comprises, for each of said RF reception coils, forming said complete image dataset by a blockwise reconstruction for each data point in the reduced dataset for the RF reception coil for which the complete image dataset is being formed, employing more than one data point for that RF reception coil and more than one data point for said other of said RF reception coils.

6. A method as claimed in claim 4 wherein step (d) comprises, for each of said RF reception coils, forming said complete image dataset by a blockwise reconstruction for each data point in the reduced dataset for the RF reception coil for which the complete image dataset is being formed, employing more than one data line for that RF reception coil and more than one data line for said other of said RF reception coils.

7. A method as claimed in claim 1 wherein step (d) comprises, for each of said RF reception coils, forming said complete image dataset from the reduced dataset for that RF reception coil and the respective reduced datasets of all others of said RF reception coils.

8. A method as claimed in claim 1 wherein step (d) comprises, for each of said RF reception coils, forming said complete image dataset using spatial harmonics.

9. A method as claimed in claim 1 wherein step (e) comprises employing a Fourier transformation for spatially transforming said complete image dataset obtained in step (d) to obtain said complete image of said region.

10. A method as claimed in claim 1 comprising the additional step of linearly arranging said plurality of RF reception coils to form a linear array.

11. An apparatus for obtaining an image of an interconnected region of a subject by partially parallel acquisition magnetic resonance imaging, comprising:

a plurality of RF reception coils for exciting precessing nuclear spins in a region of a subject and for simultaneously obtaining a plurality of response signals respectively from said plurality of reception coils, representing nuclear magnetic resonance signals arising from said precessing nuclear spins, from said region;

a converter supplied with said response signals which converts sad response signals into respective datasets with each response signal representing a reduced k-space dataset for the associated RF coil;

an image computer supplied with said reduced datasets which organizes the respective reduced k-space datasets into respective k-space matrices and the additionally acquired calibration data points into respective k-space matrices and which, for each of said RF reception coils, forms a complete dataset in k-space from the k-space matrix, and said calibration data points, for that RF reception coil and the k-space matrix, and said calibration data points, of at least one other of said RF reception coils and which, for each of said RF reception coils, spatially transforms the complete dataset in k-space to obtain a complete image of said region, and thereby obtaining a plurality of complete images of said region.

12. An apparatus as claimed in claim 11 wherein said image computer combines said plurality of complete images to obtain a single composite image of said region.

13. An apparatus as claimed in claim 12 wherein said image computer combines said complete images using a square sum reconstruction to obtain said single composite image.

14. An apparatus as claimed in claim 11 wherein each of said reduced datasets represents a plurality of k-space lines, and said image computer enters data from the respective response signals line-by-line respectively into said plurality of k-space matrices for the respective RF reception coils, and, in each k-space matrix, enters at least one line of said calibration data points.

15. An apparatus as claimed in claim 14 wherein each of said lines is comprised of a plurality of data points, and wherein said image computer, for each of said RF reception coils, forms said complete image dataset by a blockwise reconstruction for each data point in the k-space matrix of the RF reception coil for which the complete image dataset is being formed, employing more than one data point for that RF reception coil and more than one data point for said other of said RF reception coils.

16. An apparatus as claimed in claim 14 wherein said image computer, for each of said RF reception coils, forms said complete image dataset by a blockwise reconstruction for each data line in the, k-space matrix of the RF reception coil for which the complete image dataset is being formed, employing more than one data line for that RF reception coil and more than one data line for said other of said RF reception coils.

17. An apparatus as claimed in claim 11 wherein said image computer, for each of said RF reception coils, forms said complete image dataset from the k-space matrix for that RF reception coil and the respective k-space matrices of all others of said RF reception coils.

18. An apparatus as claimed in claim 11 wherein said image computer, for each of said RF reception coils, forms said complete image dataset using spatial harmonics.

19. An apparatus as claimed in claim 11 wherein said image computer employs a Fourier transformation for spatially transforming said complete image dataset to obtain said complete image of said region.

20. An apparatus as claimed in claim 11 wherein said RF coils are linearly arranged to form a linear array.

* * * * *